(12) United States Patent
Su

(10) Patent No.: US 11,962,112 B2
(45) Date of Patent: Apr. 16, 2024

(54) CONNECTOR AND MANUFACTURING METHOD

(71) Applicant: GUANGZHOU FANGBANG ELECTRONICS CO., LTD., Guangzhou (CN)

(72) Inventor: Zhi Su, Guangzhou (CN)

(73) Assignee: GUANGZHOU FANGBANG ELECTRONICS CO., LTD., Guangzhou (CN)

( * ) Notice: Subject to any disclaimer, the term of this patent is extended or adjusted under 35 U.S.C. 154(b) by 288 days.

(21) Appl. No.: 17/285,154

(22) PCT Filed: Jul. 15, 2019

(86) PCT No.: PCT/CN2019/095935
§ 371 (c)(1),
(2) Date: Apr. 14, 2021

(87) PCT Pub. No.: WO2020/093728
PCT Pub. Date: May 14, 2020

(65) Prior Publication Data
US 2021/0367380 A1    Nov. 25, 2021

(30) Foreign Application Priority Data

Nov. 9, 2018 (CN) .......................... 201811329980.4

(51) Int. Cl.
*H01R 13/03* (2006.01)
*H01R 12/71* (2011.01)
(Continued)

(52) U.S. Cl.
CPC ....... *H01R 13/6485* (2013.01); *H01R 12/716* (2013.01); *H01R 13/03* (2013.01); *H01R 43/16* (2013.01)

(58) Field of Classification Search
CPC .. H01R 13/6485; H01R 12/716; H01R 13/03; H01R 43/16; H01R 4/04; H01R 12/52;
(Continued)

(56) References Cited

U.S. PATENT DOCUMENTS 5,639,389 A * 6/1997 Schmidt ............... H05K 3/0041
216/100
5,672,062 A * 9/1997 Lindeman .......... H01R 13/2407
439/91
(Continued)

FOREIGN PATENT DOCUMENTS

CN        201725896 U    1/2011
CN        103404239 A    11/2013
(Continued)

OTHER PUBLICATIONS

International Search Report for corresponding application PCT/CN2019/095935 filed Jul. 15, 2019; Report dated Oct. 16, 2019.

(Continued)

*Primary Examiner* — Abdullah A Riyami
*Assistant Examiner* — Nelson R. Burgos-Guntin
(74) *Attorney, Agent, or Firm* — CANTOR COLBURN LLP

(57) ABSTRACT

A connector and a manufacturing method of the connector are provided. The connector, comprising an insulator (10), a first conductive layer (11) disposed on one side surface of the insulator (10), and a second conductive layer (12) disposed on the other side surface of the insulator (10), the insulator (10) is further provided with a conductive medium (13) connecting the first conductive layer (11) and the second conductive layer (12), and a protrusion portion (14) is disposed on the surface of the first conductive layer (11) or/and the second conductive layer (12).

29 Claims, 4 Drawing Sheets

(51) Int. Cl.
  *H01R 13/648*  (2006.01)
  *H01R 43/16*  (2006.01)
(58) Field of Classification Search
  CPC ...... H01R 12/55; H05K 3/0061; H05K 3/368;
      H05K 1/0215; H05K 3/427; H05K
      2201/10378; H05K 2203/0307
  See application file for complete search history.

(56) References Cited

U.S. PATENT DOCUMENTS

| | | | | |
|---|---|---|---|---|
| 5,769,996 | A * | 6/1998 | McArdle | H01F 41/16 156/305 |
| 6,780,028 | B1 * | 8/2004 | Kennedy | H05K 3/366 439/876 |
| 6,875,921 | B1 * | 4/2005 | Conn | H05K 1/0231 257/E23.079 |
| 7,233,061 | B1 * | 6/2007 | Conn | H01L 23/50 257/E23.079 |
| 8,268,246 | B2 * | 9/2012 | Srinivasan | B01L 3/502707 422/81 |
| 9,707,738 | B1 * | 7/2017 | Cheng | B32B 37/10 |
| 10,431,918 | B2 * | 10/2019 | Oda | C23C 14/025 |
| 2003/0100197 | A1 * | 5/2003 | Veitschegger | H05K 3/429 439/55 |
| 2003/0181104 | A1 * | 9/2003 | Brunker | H05K 1/024 439/637 |
| 2009/0161331 | A1 * | 6/2009 | Sato | H05K 3/365 361/803 |
| 2010/0065194 | A1 * | 3/2010 | Nagase | H05K 3/427 156/230 |
| 2010/0096662 | A1 * | 4/2010 | Lin | H01L 33/486 257/E33.056 |
| 2010/0181594 | A1 * | 7/2010 | Lin | H01L 21/486 257/E33.056 |
| 2010/0327310 | A1 * | 12/2010 | Lin | H05K 1/0204 257/E33.075 |
| 2011/0151626 | A1 * | 6/2011 | Lin | H01L 23/49827 438/118 |
| 2011/0170227 | A1 * | 7/2011 | Schmid | H05K 1/056 174/257 |
| 2011/0201157 | A1 * | 8/2011 | Lin | H01L 21/486 438/118 |
| 2012/0032203 | A1 * | 2/2012 | Urano | F21V 29/83 257/E33.066 |
| 2014/0085850 | A1 * | 3/2014 | Li | H05K 1/0231 29/841 |
| 2014/0231126 | A1 * | 8/2014 | Hunrath | H05K 3/4069 174/264 |
| 2015/0382461 | A1 | 12/2015 | Ha | |
| 2016/0358841 | A1 * | 12/2016 | Eid | H05K 1/181 |
| 2017/0042034 | A1 * | 2/2017 | Maccurdy | H05K 3/125 |
| 2018/0049311 | A1 * | 2/2018 | Hoang | H01L 25/0652 |
| 2019/0057940 | A1 * | 2/2019 | Cheah | H01L 25/50 |
| 2021/0384654 | A1 * | 12/2021 | Su | H01R 12/79 |

FOREIGN PATENT DOCUMENTS

| | | |
|---|---|---|
| CN | 103857189 A | 6/2014 |
| CN | 105101761 A | 11/2015 |
| CN | 105778815 A | 7/2016 |
| CN | 206271924 U | 6/2017 |
| CN | 209232989 U | 8/2019 |
| CN | 209232990 U | 8/2019 |
| CN | 209232991 U | 8/2019 |
| CN | 209233016 U | 8/2019 |
| IN | 201656033 U | 11/2010 |
| WO | 2016158775 A1 | 10/2016 |

OTHER PUBLICATIONS

International Search Report for corresponding application PCT/CN2019/095936 filed Jul. 15, 2019; dated Oct. 16, 2019.

* cited by examiner

CONNECTOR AND MANUFACTURING METHOD

CROSS REFERENCE TO RELATED APPLICATIONS

This application is the national stage of International Patent Application Number PCT/CN2019/095935, filed on Jul. 15, 2019, which claims priority to Chinese Patent Application Number 201811329980.4 filed on Nov. 9, 2018, the contents of both of said applications are all hereby incorporated by reference.

TECHNICAL FIELD

The disclosure relates to the technical field of electrical connectors, and in particular to a connector and a manufacturing method.

BACKGROUND

A conductive adhesive is an adhesive with certain conductivity after curing or drying. It can connect a variety of conductive materials together to form an electrical path between the connected materials. The conductive adhesive has become an indispensable new material in the electronic industry. However, the conductive adhesive still has the following problems:

Firstly, if too many particles and less glue are arranged in the conductive adhesive in order to ensure electrical connection, the adhesion performance cannot be ensured, and the conductive adhesive is easy to fall off; if few particles and more glue are arranged in order to ensure the adhesion performance, the resistance is relatively large, and the electrical connection performance is poor.

Secondly, the electrical connection performance is unstable, due to the influence of factors such as stress and climate, the volume or the shape of a matrix of the conductive adhesive is easy to gradually change or suddenly change, so that the stacking state of conductive particles in the conductive adhesive is easy to change, the conduction effect of the conductive adhesive and a ground layer of a circuit board is not ideal, static charges accumulated on the circuit board cannot be well guided out, and the static charges are accumulated on the circuit board to form an interference source, thereby affecting the signal transmission.

SUMMARY

In order to solve the above technical problem that the electrical connection performance of a conductive adhesive is unstable, the disclosure provides a connector and a manufacturing method. The connector is used for mounting and connecting a circuit board, and has the advantages of being repeatedly disassembled and assembled, good in conductivity and the like. Moreover, the manufacturing method thereof is simple and easy to implement.

Based on this, the disclosure provides a connector, which comprises an insulator, a first conductive layer disposed on one side surface of the insulator, and a second conductive layer disposed on the other side surface of the insulator, the insulator being further provided with a conductive medium connecting the first conductive layer and the second conductive layer, and a protrusion portion being disposed on the surface of the first conductive layer or/and the second conductive layer.

As a solution, the protrusion portion has a regular solid geometry or irregular solid geometry.

As a solution, the protrusion portion has a pointed corner shape, an inverted cone shape, a granular shape, a dendritic shape, a columnar shape, or a block shape.

As a solution, the protrusion portion has a height of 1 μm to 30 μm.

As a solution, the surfaces of the first conductive layer or/and the second conductive layer are provided with two or more of the protrusion portions, each one of the protrusion portions having the same or different shapes, each one of the protrusion portions having the same or different sizes, as well as two or more of the protrusion portions being continuously or discontinuously distributed on the surfaces of the first conductive layer or/and the second conductive layer.

As a solution, the surfaces of the first conductive layer or/and the second conductive layer are rough.

As a solution, the surfaces of the first conductive layer or/and the second conductive layer are flat.

As a solution, the protrusion portion is made of one or a combination of a group consist of copper, nickel, tin, lead, chromium, molybdenum, zinc, gold, and silver.

As a solution, the protrusion portion is provided with an adhesive film layer, and the protrusion portion is hidden in the adhesive film layer or penetrates through the adhesive film layer and is exposed.

As a solution, the insulator is provided with a connection hole connecting the first conductive layer and the second conductive layer, and the conductive medium is disposed in the connection hole.

As a solution, the conductive medium fills the whole of the connection hole, or the conductive medium is attached to a hole wall of the connection hole and forms a conductive hole.

As a solution, the insulator is provided with two or more of the connection holes.

As a solution, the insulator is made of one or a combination of a group consist of polyimide, thermoplastic polyimide, modified epoxy resin, modified acrylic resin, polyethylene terephthalate, polybutylene terephthalate, polyethylene, polyethylene naphthalate, polystyrene, polyvinyl chloride, polysulfone, polyphenylene sulfide, polyetheretherketone, polyphenylene oxide, polytetrafluoroethylene, liquid crystal polymers, and polyparabanic acid.

As a solution, the first conductive layer and the second conductive layer are disposed on two opposite side surfaces of the insulator, and the protrusion portion is a plated protrusion portion.

As a solution, the protrusion portion is hidden in the adhesive film layer, the thickness of the adhesive film layer being smaller than an average value of the height of the protrusion portion.

The disclosure also provides a manufacturing method of a connector, which includes the following steps.

A flexible copper-clad plate is manufactured, the flexible copper-clad plate including an insulator and copper foils disposed on two opposite surfaces of the insulator.

A connection hole is formed on the flexible copper-clad plate.

A conductive medium is formed in the connection hole to make the connection hole conductive, while forming a protrusion portion on the surface of the copper foil on at least one side of the flexible copper-clad plate.

Further, in the manufacturing method of a connector, the connection hole connecting the copper foils on two sides is formed in the flexible copper-clad plate by means of mechanical drilling, laser drilling or punching.

Further, in the manufacturing method of a connector, the operation that the conductive medium is formed in the connection hole while forming the protrusion portion on the surface of the copper foil on at least one side of the flexible copper-clad plate specifically includes that:

a layer of thin conductive medium is deposited on a hole wall of the connection hole through a chemical reaction, the thickness of the conductive medium on the hole wall is increased and a conductive hole is formed by one or more of electroplating, chemical plating, physical vapor deposition, and chemical vapor deposition, while forming the protrusion portion on the surface of the copper foil on at least one side of the flexible copper-clad plate;

or a layer of thin conductive medium is deposited on a hole wall of the connection hole through a chemical reaction, the connection hole is filled with the conductive medium by one or more of electroplating, chemical plating, physical vapor deposition, and chemical vapor deposition, while forming the protrusion portion on the surface of the copper foil on at least one side of the flexible copper-clad plate.

Further, in the manufacturing method of a connector, after forming the protrusion portion on the surface of the copper foil on at least one side of the flexible copper-clad plate, the method further includes that: an adhesive film layer is formed on the surface of the copper foil of the flexible copper-clad plate provided with the protrusion portion, specifically including that:

the adhesive film layer is coated on a release film, and then the adhesive film layer is laminated and transferred to the surface of the copper foil of the flexible copper-clad plate provided with the protrusion portion through the release film;

or the adhesive film layer is directly coated on the surface of the copper foil of the flexible copper-clad plate provided with the protrusion portion.

The disclosure also provides a second manufacturing method of a connector, which includes the following steps.

A flexible copper-clad plate is manufactured, the flexible copper-clad plate including an insulator and copper foils disposed on two opposite surfaces of the insulator.

A connection hole is formed on the flexible copper-clad plate.

A conductive medium is formed in the connection hole to make the connection hole conductive.

A protrusion portion is formed on the surface of the copper foil on at least one side of the flexible copper-clad plate.

Further, in the manufacturing method of a connector, the connection hole connecting the copper foils on two sides is formed in the flexible copper-clad plate by means of mechanical drilling, laser drilling or punching.

Further, in the manufacturing method of a connector, the operation that the conductive medium is formed in the connection hole specifically includes that:

a layer of thin conductive medium is deposited on a hole wall of the connection hole through a chemical reaction, the thickness of the conductive medium on the hole wall is increased and a conductive hole is formed by one or more of electroplating, chemical plating, physical vapor deposition, and chemical vapor deposition;

or a layer of thin conductive medium is deposited on a hole wall of the connection hole through a chemical reaction, the connection hole is filled with the conductive medium by one or more of electroplating, chemical plating, physical vapor deposition, and chemical vapor deposition.

Further, in the manufacturing method of a connector, the protrusion portion is formed on the surface of the copper foil on at least one side of the flexible copper-clad plate by one or more of electroplating, chemical plating, physical vapor deposition, and chemical vapor deposition.

Further, in the manufacturing method of a connector, after forming the protrusion portion on the surface of the copper foil on at least one side of the flexible copper-clad plate, the method further includes that: an adhesive film layer is formed on the surface of the copper foil of the flexible copper-clad plate provided with the protrusion portion, specifically including that:

the adhesive film layer is coated on a release film, and then the adhesive film layer is laminated and transferred to the surface of the copper foil of the flexible copper-clad plate provided with the protrusion portion through the release film;

or the adhesive film layer is directly coated on the surface of the copper foil of the flexible copper-clad plate provided with the protrusion portion.

The disclosure also provides a third manufacturing method of a connector, which includes the following steps.

A flexible copper-clad plate is manufactured, the flexible copper-clad plate including an insulator and copper foils disposed on two opposite surfaces of the insulator.

A protrusion portion is formed on the surface of the copper foil on at least one side of the flexible copper-clad plate.

A connection hole is formed on the flexible copper-clad plate.

A conductive medium is formed in the connection hole to make the connection hole conductive.

Further, in the manufacturing method of a connector, the protrusion portion is formed on the surface of the copper foil on at least one side of the flexible copper-clad plate by one or more of electroplating, chemical plating, physical vapor deposition, and chemical vapor deposition.

Further, in the manufacturing method of a connector, the connection hole connecting the copper foils on two sides is formed in the flexible copper-clad plate by means of mechanical drilling, laser drilling or punching.

Further, in the manufacturing method of a connector, the operation that the conductive medium is formed in the connection hole specifically includes that:

a layer of thin conductive medium is deposited on a hole wall of the connection hole through a chemical reaction, the thickness of the conductive medium on the hole wall is increased and a conductive hole is formed by one or more of electroplating, chemical plating, physical vapor deposition, and chemical vapor deposition;

or a layer of thin conductive medium is deposited on a hole wall of the connection hole through a chemical reaction, the connection hole is filled with the conductive medium by one or more of electroplating, chemical plating, physical vapor deposition, and chemical vapor deposition.

Further, in the manufacturing method of a connector, after forming the conductive medium in the connection hole, the method further includes that: an adhesive film layer is formed on the surface of the copper foil of the flexible copper-clad plate provided with the protrusion portion, specifically including that:

the adhesive film layer is coated on a release film, and then the adhesive film layer is laminated and transferred to the surface of the copper foil of the flexible copper-clad plate provided with the protrusion portion through the release film;

or the adhesive film layer is directly coated on the surface of the copper foil of the flexible copper-clad plate provided with the protrusion portion.

The implementation of the embodiments of the disclosure has the following beneficial effects.

The connector provided by the embodiments of the disclosure includes an insulator, a first conductive layer disposed on one side surface of the insulator, and a second conductive layer disposed on the other side surface of the insulator. The insulator is further provided with a conductive medium connecting the first conductive layer and the second conductive layer, and a protrusion portion is disposed on the surface of the first conductive layer or/and the second conductive layer. Based on the above structure, on one hand, the connector provided by the embodiments of the disclosure can be clamped between two circuit boards or between a circuit board and a ground metal plate, and a conductive layer is adhered to the circuit board or the ground metal plate, so that the circuit conduction is realized. Therefore, compared with the traditional welding and adhesion, the connector not only can realize repeated disassembly and assembly of the circuit board, is convenient for maintenance of the circuit board and reduces the manufacturing cost of electronic products, but also can ensure the mounting reliability of the circuit board while realizing effective electrical connection. On the other hand, when the connector provided by the embodiments of the disclosure is clamped between the circuit board and the ground metal plate, the protrusion portion can ensure that the conductive layer is effectively electrically connected with a ground layer of the circuit board and the ground metal plate, so that the connector can effectively guide out static charges accumulated on the circuit board, and the influence on signal transmission caused by interference sources formed by accumulation of the static charges on the circuit board is avoided.

The disclosure also provides a manufacturing method of the connector, which has the advantages of simple operation, easiness in implementation and the like.

BRIEF DESCRIPTION OF THE DRAWINGS

The accompanying drawings, which constitute a part of this application, are used to provide a further understanding of the disclosure, and the exemplary embodiments of the disclosure and the description thereof are used to explain the disclosure, but do not constitute improper limitations to the disclosure. In the drawings.

DESCRIPTION OF THE REFERENCE SIGNS 10, insulator; 11, first conductive layer; 12, second conductive layer; 13, conductive medium; 14, protrusion portion; 15, conductive hole; 16, adhesive film layer.

DETAILED DESCRIPTION OF THE EMBODIMENTS

It is to be noted that embodiments in the present application and characteristics in the embodiments can be combined under the condition of no conflicts.

The technical solutions in the embodiments of the disclosure will be clearly and completely described hereinbelow with the drawings in the embodiments of the disclosure. It is apparent that the described embodiments are only part of the embodiments of the disclosure, not all of the embodiments. On the basis of the embodiments of the disclosure, all other embodiments obtained on the premise of no creative work of those of ordinary skill in the art fall within the scope of protection of the disclosure.

Embodiment 1

Figure 1:
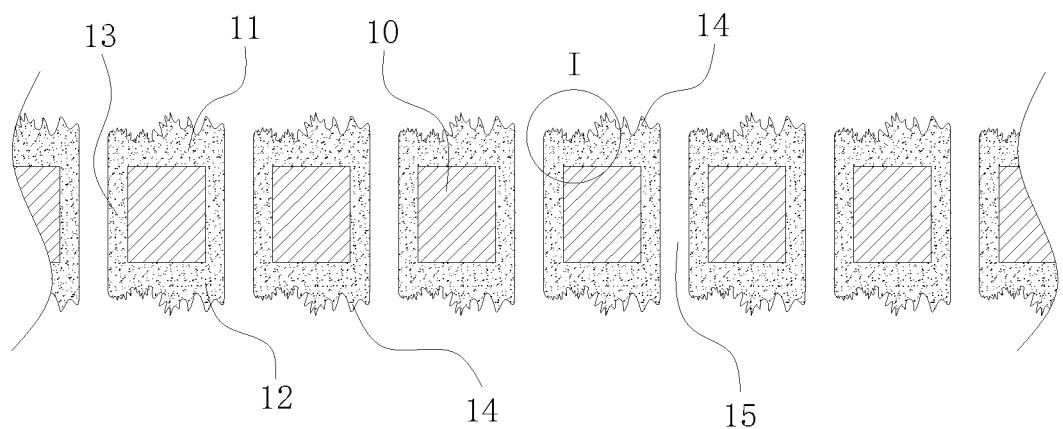
FIG. 1 is a schematic cross-sectional structure view of a connector according to Embodiment 1 of the disclosure.

As shown in FIG. 1, the embodiment of the disclosure provides a connector, which mainly includes an insulator 10, a first conductive layer 11 disposed on one side surface of the insulator 10, and a second conductive layer 12 disposed on the other side surface of the insulator 10. The insulator 10 is further provided with a conductive medium 13 connecting the first conductive layer 11 and the second conductive layer 12, and protrusion portions 14 are disposed on the surfaces of the first conductive layer 11 and the second conductive layer 12. The first conductive layer 11 and the second conductive layer 12 are disposed on two opposite side surfaces of the insulator 10, and the protrusion portions 14 are plated protrusion portions.

Based on the above structure, on one hand, the connector provided by the embodiment of the disclosure can be clamped between two circuit boards or between a circuit board and a ground metal plate, and the first conductive layer 11 and the second conductive layer 12 are adhered to the circuit board or the ground metal plate respectively, so that the circuit conduction between the two circuit boards or between the circuit board and the ground metal plate is realized. Therefore, compared with the traditional welding and adhesion, the connector not only can realize repeated disassembly and assembly of the circuit board, is convenient for maintenance of the circuit board and reduces the manufacturing cost of electronic products, but also can ensure the mounting reliability of the circuit board while realizing effective electrical connection. On the other hand, when the connector provided by the embodiment of the disclosure is clamped between the circuit board and the ground metal plate, the protrusion portions 14 are plated protrusion portions having a larger hardness than the conducive adhesive in the conventional art. Therefore, it can be ensured that the first conductive layer 11 and the second conductive layer 12 are effectively electrically connected with a ground layer of the circuit board and the ground metal plate respectively, so that the connector can effectively guide out static charges accumulated on the circuit board, and the influence on signal transmission caused by interference sources formed by accumulation of the static charges on the circuit board is avoided.

Specifically, as shown in FIG. 1 to FIG. 8, the protrusion portions 14 have a regular solid geometry or irregular solid geometry, for example, a pointed corner shape, an inverted cone shape, a granular shape, a dendritic shape, a columnar shape, a block shape, etc. Moreover, regardless of the shape, the protrusion portions 14 have a height of 1 μm to 30 μm, where 2.5 μm to 15 μm is the most preferable range. Based on this, the surfaces of the first conductive layer 11 and the second conductive layer 12 are provided with two or more protrusion portions 14. The protrusion portions 14 can have the same or different shapes, and the protrusion portions 14 can also have the same or different sizes. That is to say, the shape of the two or more protrusion portions 14 can be one or more of a pointed corner shape, an inverted cone shape, a granular shape, a dendritic shape, a columnar shape, and a block shape. Moreover, the two or more protrusion portions 14 of the same shape can have different sizes including the above height and the length of the protrusion portions 14 in a direction parallel to the side surface of the insulator 10. In addition, the two or more protrusion portions 14 are continuously or discontinuously distributed on the surfaces of the first conductive layer 11 and the second conductive layer 12. For example, when the shapes of the two or more protrusions 14 are pointed and continuously distributed, a regular and periodic tooth-like three-dimensional pattern can be formed, or an irregular and disordered tooth-like three-dimensional pattern can be formed. Of course, only one of these cases is enumerated herein, and combinations of other shapes described above are within the scope of the present application and are not specifically enumerated herein.

Figure 2:
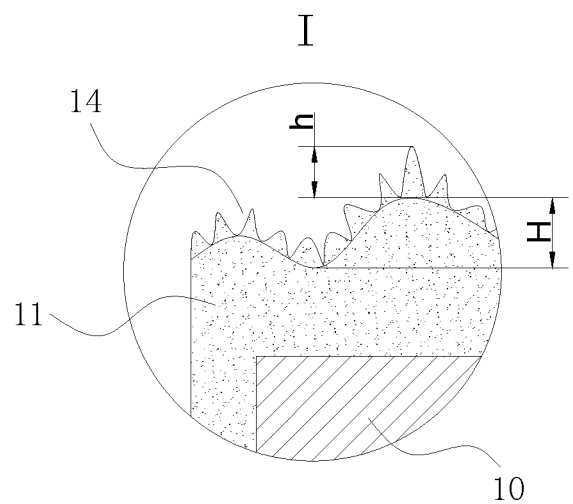
FIG. 2 is an enlarged view of region I of FIG. 1.
Figure 3:
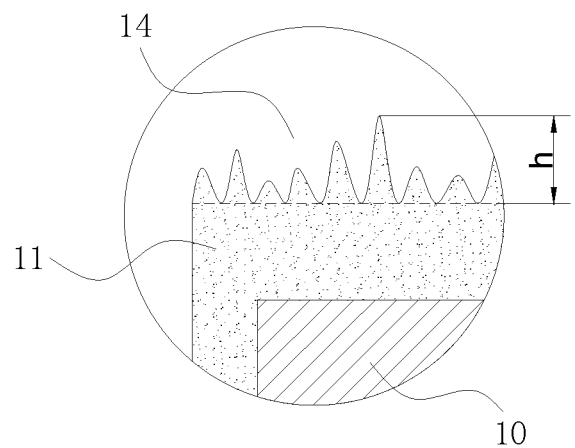
FIG. 3 is a partial view of a first conductive layer having a flat surface according to Embodiment 1 of the disclosure.

Optionally, as shown in FIG. 2 and FIG. 3, the surfaces of the first conductive layer 11 and the second conductive layer 12 can be flat surfaces or rough surfaces. It is to be noted that the flat and rough surfaces referred to herein are the surfaces of the first conductive layer 11 and the second conductive layer 12 on which the protrusion portions 14 are located, that is, reference surfaces on which the protrusion portions 14 are located, rather than a plane formed by the two or more protrusion portions 14. When the surfaces of the first conductive layer 11 and the second conductive layer 12 are rough surfaces, the surfaces include concave portions and convex portions, the protrusion portions 14 can be distributed either in the concave portions or in the convex portions, and the sum of the height H of any convex portion and the height h of the protrusion portion 14 on the convex portion can also be 1 μm to 30 μm. Of course, it is also possible that the height h of the protrusion portion 14 on the convex portion is 1 μm to 30 μm, and then the sum of the height H of the convex portion and the height h of the protrusion portion 14 on the convex portion is greater than 1 μm to 30 μm, thereby further enhancing the electrical connection performance of the connector.

Optionally, the protrusion portion 14 is made of one or a combination of a group consist of copper, nickel, lead, chromium, molybdenum, zinc, tin, gold, and silver. Specifically, the protrusion portion 14 can be a single component, i.e., one of copper, nickel, tin, lead, chromium, molybdenum, zinc, gold, and silver. One or more of copper, nickel, tin, lead, chromium, molybdenum, zinc, gold, and silver can also serve as a main body, and then one or more metals other than the main body are formed on the surface of the main body by one or more of electroplating, chemical plating, physical vapor deposition, and chemical vapor deposition, thereby forming the protrusion portion 14 of a composite material. In the present embodiment, the protrusion portion 14 is preferably made of a composite material obtained by forming one or more metals of nickel, tin, lead, chromium, molybdenum, zinc, gold, and silver on the surface of copper which serves as a main body, because the protrusion portion 14 made of copper alone is easily oxidized or abraded and nickel, tin, gold and silver formed on the surface of copper can improve the corrosion resistance and wear resistance of the protrusion portion 14, thereby improving the conductivity of the connector and prolonging the service life of the connector.

Figure 9:
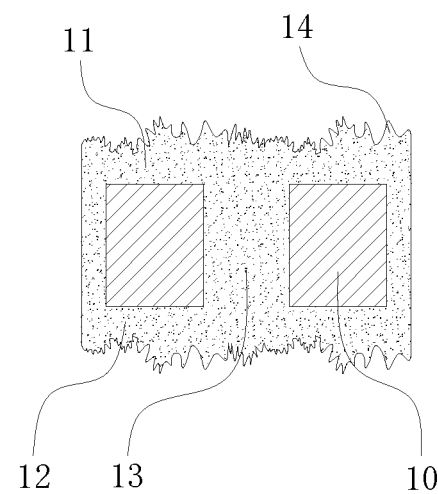
FIG. 9 is a schematic cross-sectional structure view of a connection hole filled with a conductive medium according to Embodiment 1 of the disclosure.

As shown in FIG. 1, the insulator 10 is provided with a connection hole connecting the first conductive layer 11 and the second conductive layer 12, the conductive medium 13 is attached to a hole wall of the connection hole and forms a conductive hole 15, and the conductive hole 15 can be a through hole or a buried hole or a blind hole. Of course, as shown in FIG. 9, during the formation of the conductive medium 13, an operator can also choose to fill the entire connection hole with the conductive medium 13, i.e., the conductive hole 15 is not formed. In addition, two or more connection holes can be provided between the first conductive layer 11 and the second conductive layer 12, and a conductive medium 13 is arranged in each connection hole to further improve the conductivity of the connector.

Optionally, the insulator 10 is made of one or a combination of a group consist of polyimide, thermoplastic polyimide, modified epoxy resin, modified acrylic resin, polyethylene terephthalate, polybutylene terephthalate, polyethylene, polyethylene naphthalate, polystyrenepoly, polyvinyl chloride, polysulfone, polyphenylene sulfide, polyetheretherketone, polyphenylene oxide, polytetrafluoroethylene, liquid crystal polymers, and polyparabanic acid. Specifically, the insulator 10 can be a single component, i.e., one of the various insulating materials described above, or can be formed by compounding any of the various insulating materials described above. Based on this, the insulator 10 has a certain amount of deformation, and when the connector is press-fitted with a circuit board, the protrusion portions 14 which are first in contact with the circuit board are compressed backward, so that the relatively lower protrusion portions 14 can also be in contact with the circuit board, thereby ensuring reliable electrical connection between the first conductive layer 11 and the second conductive layer 12 and the circuit board.

It is to be noted that according to different practical applications, the connector provided by the embodiment of the disclosure can also be provided with the protrusion portion 14 only on the surface of the first conductive layer 11 or the second conductive layer 12. However, during use, in order to improve the effect of electrical conduction, a person skilled in the art will inevitably attach the first conductive layer 11 or the second conductive layer 12 provided with the protrusion portion 14 to the circuit board, thereby effectively ensuring the guidance of static charges. In addition, the conductive medium 13 in the embodiment of the disclosure is preferably copper, but other materials having good conductivity such as tin, silver, gold, graphite, copper paste, silver paste, solder paste, and carbon nanotubes can be selected.

Figure 4:
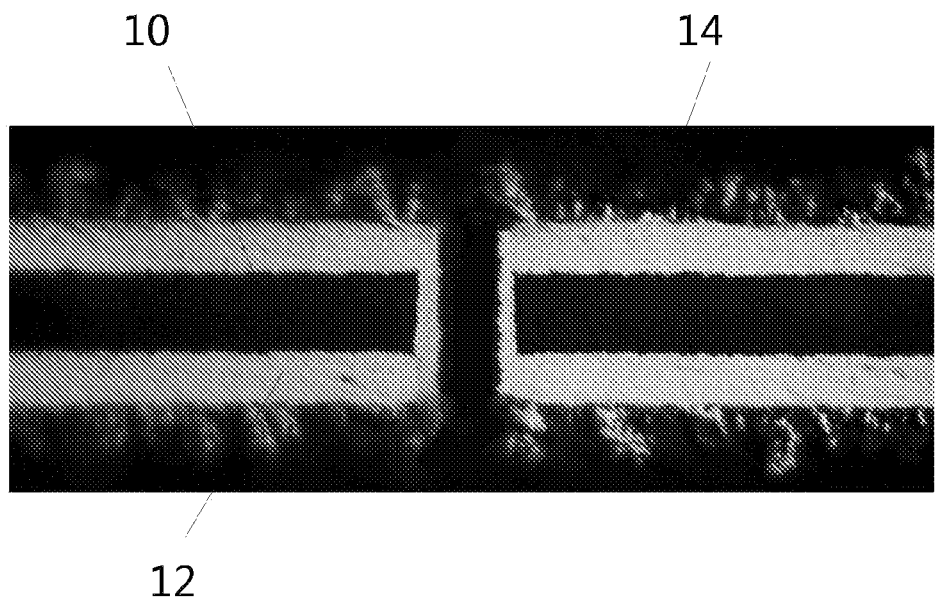
FIG. 4 is a sectional view (1) of a portion of a connector at a magnification of 400× under a metallurgical microscope according to Embodiment 1 of the disclosure.

The connector structure shown in FIG. 4 includes an insulator, a first conductive layer disposed on one side surface of the insulator, and a second conductive layer disposed on the other side surface of the insulator. The surfaces of the first conductive layer and the second conductive layer are provided with protrusion portions, the insulator is further provided with a connection hole connecting the first conductive layer and the second conductive layer, and the conductive medium is attached to a hole wall of the connection hole to form a conductive hole.

Figure 5:
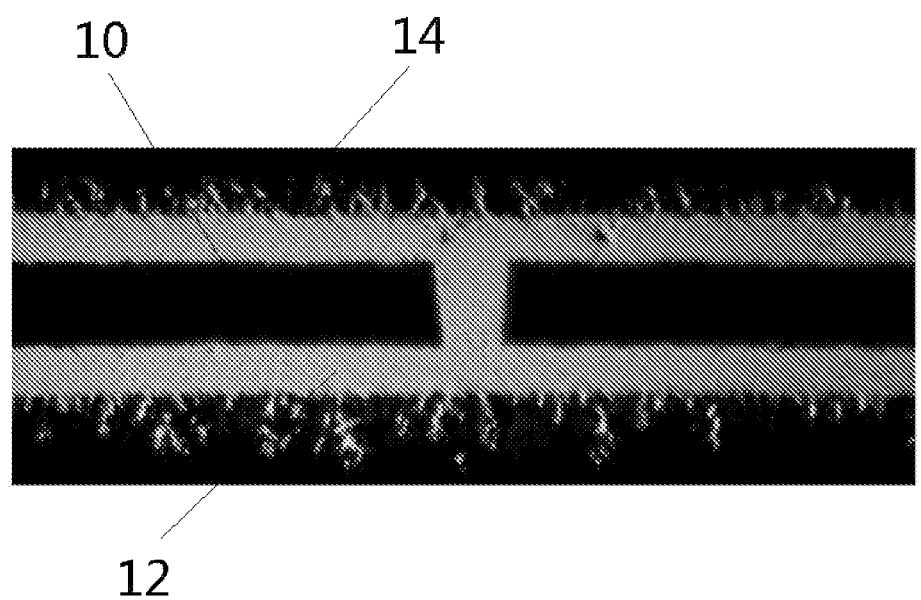
FIG. 5 is a sectional view (2) of a portion of a connector at a magnification of 400× under a metallurgical microscope according to Embodiment 1 of the disclosure.

FIG. 5 shows a connector of another structure. FIG. 5 differs from FIG. 4 in that: FIG. 5 is a case where a conductive medium fills a connection hole.

Figure 6:
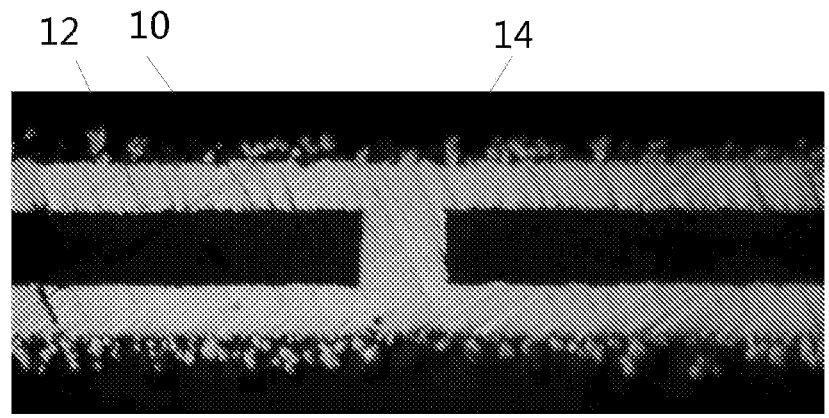
FIG. 6 is a sectional view (3) of a portion of a connector at a magnification of 400× under a metallurgical microscope according to Embodiment 1 of the disclosure.

FIG. 6 shows a connector of another structure, which differs from FIG. 5 in the shape of connection holes, the connection hole in FIG. 5 is larger at the top and smaller at the bottom, and the connection hole in FIG. 6 is relatively uniform from the top to the bottom.

Figure 7:
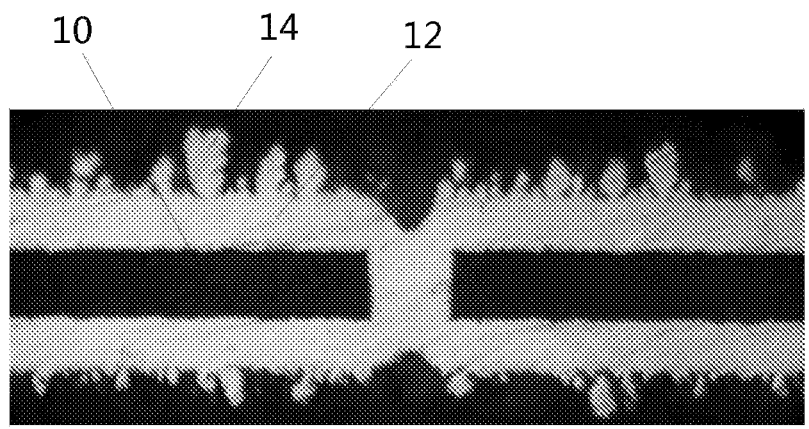
FIG. 7 is a sectional view (4) of a portion of a connector at a magnification of 400× under a metallurgical microscope according to Embodiment 1 of the disclosure.
Figure 8:
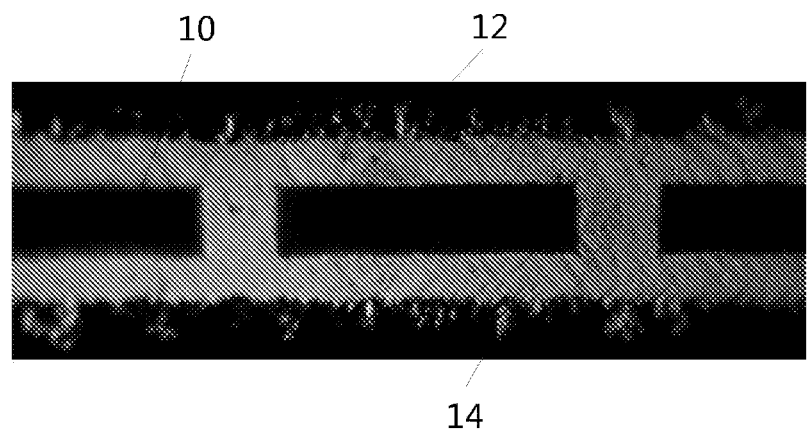
FIG. 8 is a sectional view (5) of a portion of a connector at a magnification of 400× under a metallurgical microscope according to Embodiment 1 of the disclosure.

FIG. 7 shows a connector of yet another structure, which differs from FIG. 6 in that: 1) the shape of the protrusion portion is different, which is realized by controlling the magnitude of current when the protrusion portion is formed by electroplating; and 2) the conductive medium does not completely fill the connection hole, and there are gaps in both upper and lower hole openings.

Embodiment 2

Figure 10:
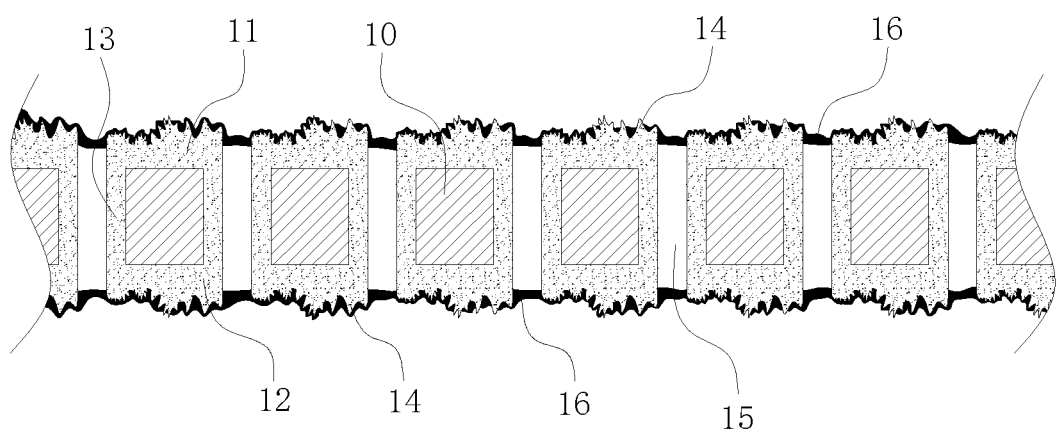
FIG. 10 is a schematic cross-sectional structure view of a connector according to Embodiment 2 of the disclosure.

As shown in FIG. 10, the connector provided by the embodiment of the disclosure differs from the connector provided by Embodiment 1 in that the protrusion portion 14 is provided with an adhesive film layer 16, each protrusion portion 14 is hidden in the adhesive film layer 16 or penetrates through the adhesive film layer 16 and is exposed, and when the protrusion portion 14 is hidden in the adhesive film layer 16, the thickness of the adhesive film layer 16 is smaller than an average value of the height of the protrusion portion 14. Based on this, when the connector is press-adhered to the circuit board, the connection between the connector and the circuit board is more stable due to the adhesion capability of the adhesive film layer 16, and the connector and the circuit board are not easy to loosen and disengage; and during the press-adhesion process, since the adhesive film layer 16 has fluidity, all or part of the protrusion portions 14 which do not penetrate through the adhesive film layer 16 have penetrated through the adhesive film layer 16 and are in contact with the circuit board together with the protrusion portions 14 which have penetrated through the adhesive film layer 16 before, so that a reliable electrical connection is formed between the first conductive layer 11 or/and the second conductive layer 12 and the circuit board, and it is ensured that the connector still has good conductivity during adhesion.

Preferably, in the embodiment of the disclosure, the adhesive film layer 16 can be a non-conductive adhesive, such as a pressure sensitive adhesive, a thermoplastic adhesive or a thermosetting adhesive, or a conductive adhesive containing conductive particles. In addition to the above differences, other specific structures of the embodiment of the disclosure are consistent with those in Embodiment 1, corresponding principles and technical effects are also consistent, and further description thereof will be omitted herein.

Hereinafter, the manufacturing method of the above connector will be described by taking a flexible copper-clad plate as a substrate for manufacturing the connector, where copper foils of the flexible copper-clad plate serve as the first conductive layer and the second conductive layer of the connector, and a person skilled in the art would be able to replace the copper foils with other materials and use the following manufacturing methods to manufacture connectors of different materials.

Embodiment 3

The embodiment of the disclosure provides a manufacturing method of a connector, which includes the following steps.

In step 1, a flexible copper-clad plate was manufactured, the flexible copper-clad plate including an insulator and copper foils disposed on two opposite surfaces of the insulator;

In step 2, a connection hole connecting the copper foils on two sides was formed in the flexible copper-clad plate by means of mechanical drilling, laser drilling or punching;

In step 3, a conductive medium 13 was formed in the connection hole to make the connection hole conductive, while forming a protrusion portion 14 on the surface of the copper foil on at least one side of the flexible copper-clad plate;

In step 4, an adhesive film layer 16 was formed on the surface of the copper foil of the flexible copper-clad plate formed with the protrusion portion 14.

In step 3 provided by the embodiment of the disclosure, the operation that the conductive medium 13 was formed in the connection hole while forming the protrusion portion 14 on the surface of the copper foil on at least one side of the flexible copper-clad plate specifically included that:

a layer of thin conductive medium 13 was deposited on a hole wall of the connection hole through a chemical reaction, the thickness of the conductive medium 13 on the hole wall was increased and a conductive hole 15 was formed by one or more of electroplating, chemical plating, physical vapor deposition, and chemical vapor deposition, while forming the protrusion portion 14 on the surface of the copper foil on at least one side of the flexible copper-clad plate;

or a layer of thin conductive medium 13 was deposited on a hole wall of the connection hole through a chemical reaction, the connection hole was filled with the conductive medium 13 by one or more of electroplating, chemical plating, physical vapor deposition, and chemical vapor deposition, while forming the protrusion portion 14 on the surface of the copper foil on at least one side of the flexible copper-clad plate.

The above-mentioned "thin conductive medium" is with respect to the subsequent continued placement of the conductive medium, the process of forming the conductive medium 13 is the process of metallizing holes in the conventional art, and the thickness of the previously formed thin conductive medium 13 can be referred to the conventional art and will not be described in detail herein.

In step 4 provided by the embodiment of the disclosure, the operation that the adhesive film layer 16 was formed on the surface of the copper foil of the flexible copper-clad plate formed with the protrusion portion 14 specifically included that:

the adhesive film layer 16 was coated on a release film, and then the adhesive film layer 16 was laminated and transferred to the surface of the copper foil of the flexible copper-clad plate formed with the protrusion portion 14 through the release film;

or the adhesive film layer 16 was directly coated on the surface of the copper foil of the flexible copper-clad plate formed with the protrusion portion 14.

Embodiment 4

The embodiment of the disclosure provides a manufacturing method of a connector, which includes the following steps.

In step 1, a flexible copper-clad plate was manufactured, the flexible copper-clad plate including an insulator and copper foils disposed on two opposite surfaces of the insulator;

In step 2, a connection hole connecting the copper foils on two sides was formed in the flexible copper-clad plate by means of mechanical drilling, laser drilling or punching;

In step 3, a conductive medium 13 was formed in the connection hole to make the connection hole conductive;

In step 4, a protrusion portion 14 was formed on the surface of the copper foil on at least one side of the flexible copper-clad plate by one or more of electroplating, chemical plating, physical vapor deposition, and chemical vapor deposition;

In step 5, an adhesive film layer 16 was formed on the surface of the copper foil of the flexible copper-clad plate formed with the protrusion portion 14. The specific methods of step 1, step 2, and step 5 are consistent with those described in the corresponding steps in Embodiment 3 and will not be described in detail herein.

In step 3 provided by the embodiment of the disclosure, the operation that the conductive medium 13 was formed in the connection hole specifically included that:

a layer of thin conductive medium 13 was deposited on a hole wall of the connection hole through a chemical reaction, the thickness of the conductive medium 13 on the hole wall was increased and a conductive hole 15 was formed by one or more of electroplating, chemical plating, physical vapor deposition, and chemical vapor deposition;

or a layer of thin conductive medium 13 was deposited on a hole wall of the connection hole through a chemical reaction, the connection hole was filled with the conductive medium 13 by one or more of electroplating, chemical plating, physical vapor deposition, and chemical vapor deposition.

And in step 4, when the protrusion portion 14 was formed on the surface of the copper foil on at least one side of the flexible copper-clad plate by one or more of electroplating, chemical plating, physical vapor deposition, chemical vapor deposition, etc., the height of the formed protrusion portion 14 could be controlled by controlling the magnitude of the current density when electroplating is adopted. Generally, when other conditions are the same, as the current density is larger, the roughness is larger, i.e. the height of the protrusion portion is larger; as the current density is smaller, the roughness is smaller, i.e. the height of the protrusion portion is smaller. By the same reasoning, it can be concluded that when the conductive medium is disposed in the connection hole, the current density can be relatively small, so that a denser conductive medium 13 is formed, and the conductive reliability is improved. When other ways are adopted, the height of the protrusion portion can also be adjusted by control of the operating conditions.

Embodiment 5

The embodiment of the disclosure provides a manufacturing method of a connector, which includes the following steps.

In step 1, a flexible copper-clad plate was manufactured, the flexible copper-clad plate including an insulator and copper foils disposed on two opposite surfaces of the insulator;

In step 2, a protrusion portion 14 was formed on the surface of the copper foil on at least one side of the flexible copper-clad plate by one or more of electroplating, chemical plating, physical vapor deposition, and chemical vapor deposition;

In step 3, a connection hole connecting the copper foils on two sides was formed in the flexible copper-clad plate by means of mechanical drilling, laser drilling or punching;

In step 4, a conductive medium 13 was formed in the connection hole to make the connection hole conductive.

In step 5, an adhesive film layer 16 was formed on the surface of the copper foil of the flexible copper-clad plate formed with the protrusion portion 14. The specific methods are consistent with those described in Embodiment 3 and will not be described in detail herein.

In step 4 provided by the embodiment of the disclosure, the operation that the conductive medium 13 was formed in the connection hole specifically included that:

a layer of thin conductive medium 13 was deposited on a hole wall of the connection hole through a chemical reaction, the thickness of the conductive medium 13 on the hole wall was increased and a conductive hole 15 was formed by one or more of electroplating, chemical plating, physical vapor deposition, and chemical vapor deposition;

or a layer of thin conductive medium 13 was deposited on a hole wall of the connection hole through a chemical reaction, the connection hole was filled with the conductive medium 13 by one or more of electroplating, chemical plating, physical vapor deposition, and chemical vapor deposition.

It is to be noted that the copper foils on two sides of the flexible copper-clad plate of Embodiments 3, 4 and 5 are the first conductive layer 11 and the second conductive layer 12 in Embodiment 1.

In summary, the disclosure provides a connector, which includes an insulator 10, a first conductive layer 11 disposed on one side surface of the insulator 10, and a second conductive layer 12 disposed on the other side surface of the insulator 10. The insulator 10 is further provided with a conductive medium 13 connecting the first conductive layer 11 and the second conductive layer 12, and a protrusion portion 14 is disposed on the surface of the first conductive layer 11 or/and the second conductive layer 12. Compared with the conventional art, the connector has the advantages of being repeatedly disassembled and assembled, good in conductivity and the like.

In addition, the disclosure also provides a manufacturing method of the connector, which has the advantages of simple operation, easiness in implementation and the like.

It should be understood that the terms "first", "second", and the like are used herein to describe various types of information, but such information should not be limited to these terms, and these terms are used solely to distinguish one type of information from another. For example, "first" information can also be referred to as "second" information, and similarly, "second" information can also be referred to as "first" information, without departing from the scope of the disclosure.

The above is a preferred implementation of the disclosure. It is to be noted that a number of modifications and variations can be made by those of ordinary skill in the art without departing from the principles of the disclosure, and such modifications and variations are also considered to be within the scope of protection of the disclosure.

What is claimed is:

1. A connector, comprising an insulator, a first conductive layer disposed on one side surface of the insulator, and a second conductive layer disposed on the other side surface of the insulator, the insulator being further provided with a conductive medium connecting the first conductive layer and the second conductive layer, and a protrusion portion being disposed on the surface of the first conductive layer or/and the second conductive layer;
wherein the connector is configured to be clamped between two circuit boards or between a circuit board and a ground metal plate, and the first conductive layer is adhered to the circuit board, the second conductive layer is adhered to the ground metal plate.

2. The connector according to claim 1, wherein the protrusion portion has a regular solid geometry or irregular solid geometry.

3. The connector according to claim 2, wherein the protrusion portion has a pointed corner shape, an inverted cone shape, a granular shape, a dendritic shape, a columnar shape, or a block shape.

4. The connector according to claim 1, wherein the protrusion portion has a height of 1 μm to 30 μm.

5. The connector according to claim 1, wherein the surfaces of the first conductive layer or/and the second conductive layer are provided with two or more of the protrusion portions, each one of the protrusion portions having the same or different shapes, each one of the protrusion portions having the same or different sizes, as well as two or more of the protrusion portions being continuously or discontinuously distributed on the surfaces of the first conductive layer or/and the second conductive layer.

6. The connector according to claim 1, wherein the surfaces of the first conductive layer or/and the second conductive layer are rough.

7. The connector according to claim 1, wherein the surfaces of the first conductive layer or/and the second conductive layer are flat.

8. The connector according to claim 1, wherein the protrusion portion is made of one or a combination of a group consist of copper, nickel, tin, lead, chromium, molybdenum, zinc, gold, and silver.

9. The connector according to claim 1, wherein the protrusion portion is provided with an adhesive film layer, and the protrusion portion is hidden in the adhesive film layer or penetrates through the adhesive film layer and is exposed.

10. The connector according to claim 1, wherein the insulator is provided with a connection hole connecting the first conductive layer and the second conductive layer, and the conductive medium is disposed in the connection hole.

11. The connector according to claim 10, wherein the conductive medium fills the whole of the connection hole, or the conductive medium is attached to a hole wall of the connection hole and forms a conductive hole.

12. The connector according to claim 10, wherein the insulator is provided with two or more of the connection holes.

13. The connector according to claim 1, wherein the insulator is made of one or a combination of a group consist of polyimide, thermoplastic polyimide, modified epoxy resin, modified acrylic resin, polyethylene terephthalate, polybutylene terephthalate, polyethylene, polyethylene naphthalate, polystyrene, polyvinyl chloride, polysulfone, polyphenylene sulfide, polyetheretherketone, polyphenylene oxide, polytetrafluoroethylene, liquid crystal polymers, and polyparabanic acid.

14. The connector according to any one of claims 1 to 13, wherein the first conductive layer and the second conductive layer are disposed on two opposite side surfaces of the insulator, and the protrusion portion is a plated protrusion portion.

15. The connector according to claim 9, wherein the protrusion portion is hidden in the adhesive film layer, a thickness of the adhesive film layer being smaller than an average value of the height of the protrusion portion.

16. A manufacturing method of a connector according to claim 1, comprising following steps:
manufacturing a flexible copper-clad plate, the flexible copper-clad plate comprising an insulator and copper foils disposed on two opposite surfaces of the insulator;
forming a connection hole on the flexible copper-clad plate; and
forming a conductive medium in the connection hole to make the connection hole conductive, while forming a protrusion portion on the surface of the copper foil on at least one side of the flexible copper-clad plate.

17. The manufacturing method according to claim 16, wherein the connection hole connecting the copper foils on two sides is formed in the flexible copper-clad plate by means of mechanical drilling, laser drilling or punching.

18. The manufacturing method according to claim 16, wherein forming the conductive medium in the connection hole while forming the protrusion portion on the surface of the copper foil on at least one side of the flexible copper-clad plate specifically comprises:
depositing a layer of thin conductive medium on a hole wall of the connection hole through a chemical reaction, increasing a thickness of the conductive medium on the hole wall and forming a conductive hole by one or more of electroplating, chemical plating, physical vapor deposition, and chemical vapor deposition, while forming the protrusion portion on the surface of the copper foil on at least one side of the flexible copper-clad plate;
or depositing a layer of thin conductive medium on a hole wall of the connection hole through a chemical reaction, filling the connection hole with the conductive medium by one or more of electroplating, chemical plating, physical vapor deposition, and chemical vapor deposition, while forming the protrusion portion on the surface of the copper foil on at least one side of the flexible copper-clad plate.

19. The manufacturing method according to claim 16, wherein after forming the protrusion portion on the surface of the copper foil on at least one side of the flexible copper-clad plate, the method further comprises: forming an adhesive film layer on the surface of the copper foil of the flexible copper-clad plate provided with the protrusion portion, specifically comprising:

coating the adhesive film layer on a release film, and then laminating and transferring the adhesive film layer to the surface of the copper foil provided with the protrusion portion through the release film;

or directly coating the adhesive film layer on the surface of the copper foil provided with the protrusion portion.

20. A manufacturing method of a connector according to claim 1, comprising following steps:

manufacturing a flexible copper-clad plate, the flexible copper-clad plate comprising an insulator and copper foils disposed on two opposite surfaces of the insulator;

forming a connection hole on the flexible copper-clad plate;

forming a conductive medium in the connection hole to make the connection hole conductive; and forming a protrusion portion on the surface of the copper foil on at least one side of the flexible copper-clad plate.

21. The manufacturing method according to claim 20, wherein the connection hole connecting the copper foils on two sides is formed in the flexible copper-clad plate by means of mechanical drilling, laser drilling or punching.

22. The manufacturing method according to claim 20, wherein forming the conductive medium in the connection hole specifically comprises:

depositing a layer of thin conductive medium on a hole wall of the connection hole through a chemical reaction, increasing a thickness of the conductive medium on the hole wall and forming a conductive hole by one or more of electroplating, chemical plating, physical vapor deposition, and chemical vapor deposition;

or depositing a layer of thin conductive medium on a hole wall of the connection hole through a chemical reaction, filling the connection hole with the conductive medium by one or more of electroplating, chemical plating, physical vapor deposition, and chemical vapor deposition.

23. The manufacturing method according to claim 20, wherein the protrusion portion is formed on the surface of the copper foil on at least one side of the flexible copper-clad plate by one or more of electroplating, chemical plating, physical vapor deposition, and chemical vapor deposition.

24. The manufacturing method according to claim 20, wherein after forming the protrusion portion on the surface of the copper foil on at least one side of the flexible copper-clad plate, the method further comprises: forming an adhesive film layer on the surface of the copper foil of the flexible copper-clad plate provided with the protrusion portion, specifically comprising:

coating the adhesive film layer on a release film, and then laminating and transferring the adhesive film layer to the surface of the copper foil of the flexible copper-clad plate provided with the protrusion portion through the release film;

or directly coating the adhesive film layer on the surface of the copper foil of the flexible copper-clad plate provided with the protrusion portion.

25. A manufacturing method of a connector according to claim 1, comprising following steps:

manufacturing a flexible copper-clad plate, the flexible copper-clad plate comprising an insulator and copper foils disposed on two opposite surfaces of the insulator;

forming a protrusion portion on the surface of the copper foil on at least one side of the flexible copper-clad plate;

forming a connection hole on the flexible copper-clad plate; and forming a conductive medium in the connection hole to make the connection hole conductive.

26. The manufacturing method according to claim 25, wherein the protrusion portion is formed on the surface of the copper foil on at least one side of the flexible copper-clad plate by one or more of electroplating, chemical plating, physical vapor deposition, and chemical vapor deposition.

27. The manufacturing method according to claim 25, wherein the connection hole connecting the copper foils on two sides is formed in the flexible copper-clad plate by means of mechanical drilling, laser drilling or punching.

28. The manufacturing method according to claim 25, wherein forming the conductive medium in the connection hole specifically comprises:

depositing a layer of thin conductive medium on a hole wall of the connection hole through a chemical reaction, increasing a thickness of the conductive medium on the hole wall and forming a conductive hole by one or more of electroplating, chemical plating, physical vapor deposition, and chemical vapor deposition;

or depositing a layer of thin conductive medium on a hole wall of the connection hole through a chemical reaction, filling the connection hole with the conductive medium by one or more of electroplating, chemical plating, physical vapor deposition, and chemical vapor deposition.

29. The manufacturing method according to claim 25, wherein after forming the conductive medium in the connection hole, the method further comprises: forming an adhesive film layer on the surface of the copper foil of the flexible copper-clad plate provided with the protrusion portion, specifically comprising:

coating the adhesive film layer on a release film, and then laminating and transferring the adhesive film layer to the surface of the copper foil of the flexible copper-clad plate provided with the protrusion portion through the release film;

or directly coating the adhesive film layer on the surface of the copper foil of the flexible copper-clad plate provided with the protrusion portion.

* * * * *